(12) United States Patent
Ashida (10) Patent No.: US 6,198,137 B1
(45) Date of Patent: Mar. 6, 2001

(54) SEMICONDUCTOR DEVICE (75) Inventor: Tsutomu Ashida, Yamatokoriyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/427,637

(22) Filed: Oct. 27, 1999

(30) Foreign Application Priority Data

Oct. 30, 1998 (JP) ................................. 10-311207

(51) Int. Cl.⁷ .......................... H01L 29/72; H01L 29/78; H01L 27/02
(52) U.S. Cl. ........................................... 257/365; 257/347
(58) Field of Search ..................................... 257/365, 347

(56) References Cited

U.S. PATENT DOCUMENTS

| 4,899,308 | 2/1990 | Khan . |
| 5,892,260 | * 4/1999 | Okumura et al. . |
| 5,998,827 | * 12/1999 | Park . |

FOREIGN PATENT DOCUMENTS

| 61-288464 | 12/1986 | (JP) . |
| 64-31456 | 2/1989 | (JP) . |
| 1-77958 | * 3/1989 | (JP) . |
| 1-181557 | 7/1989 | (JP) . |

* cited by examiner

Primary Examiner—Stephen D. Meier
(74) Attorney, Agent, or Firm—Nixon & Vanderhye P.C.

(57) ABSTRACT

A memory cell is formed in which N channel transistors A and P channel transistors B having respectively different conduction types are alternately fitted. The channel section of the N channel transistor A and the P-type drain 7a of the P channel transistor B are commonly used in a shared manner, and the channel section of the P channel transistor B and the N-type source 5b of the N channel transistor A are commonly used in a shared manner; thus, it is possible to achieve high integrity. Moreover, the junction between the adjacent P-type drain 7a and N-type source 5b is always maintained in a reverse bias state so that the P-type drain 7a and the N-type source 5b are separated. With this arrangement, the separation area between the respective transistor elements is minimized so that it is possible to provide a semiconductor device which can achieve miniaturization and high integrity.

16 Claims, 7 Drawing Sheets

SEMICONDUCTOR DEVICE

FIELD OF THE INVENTION

The present invention relates to a semiconductor device that is constituted by a plurality of memory cell transistors so as to form a memory cell array, such as a lateral-type ROM of a NOR gate type.

BACKGROUND OF THE INVENTION

In general, a ROM (Read Only Memory), utilized for writing various pieces of program information, has a MOS (Metal Oxide Semiconductor) transistor construction having a gate, a source and a drain combined in a matrix format, that is, a construction which has laminated metal, oxide (insulator) and semiconductors, and which cuts off or connects the source and the drain of the memory-use transistor, or sets two types of threshold values, in accordance with written information, so that it detects a current flowing between the drain and the source in a manner so as to correspond to "1" and "0" in stored information.

Figure 7A:
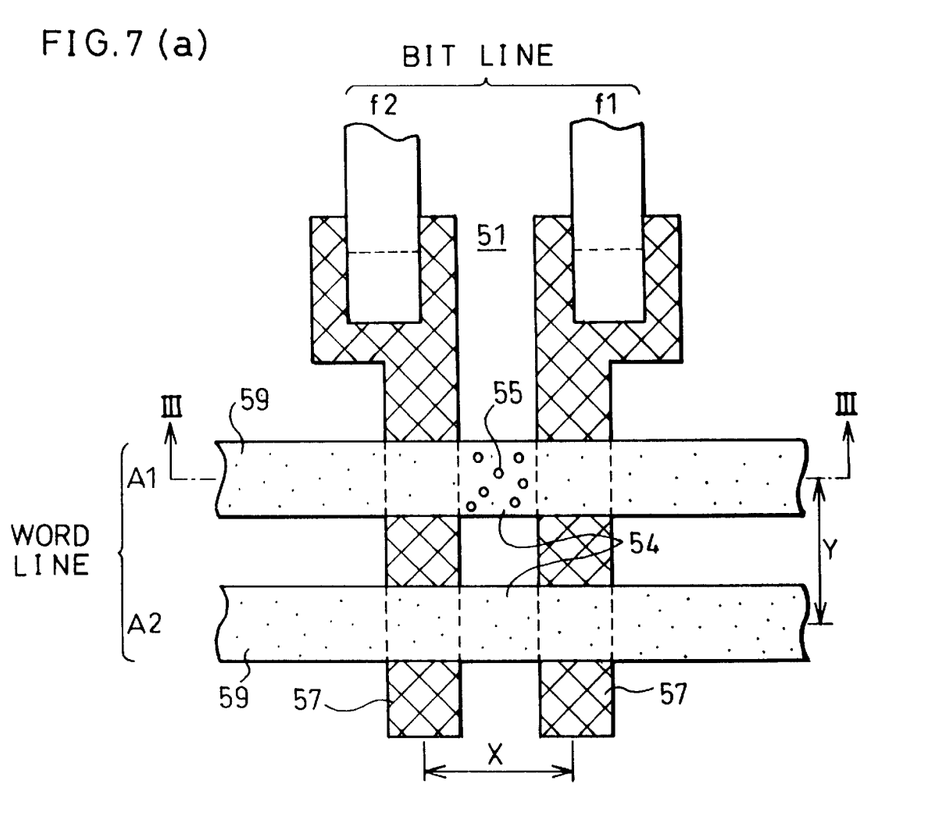
FIG. 7(a) is a plan view.
Figure 7B:
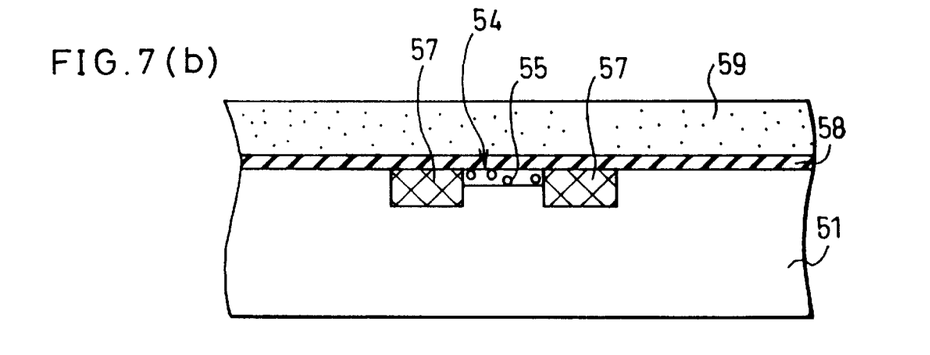
FIG. 7(b) is a cross-sectional view taken along line III—III of FIG. 7(a).

For example, as shown in FIGS. 7(a) and 7(b), such a conventional mask ROM of an NOR type with high integrity includes a P-type semiconductor (Si) substrate 51, N-type semiconductor areas 57, and gate electrodes 59. Here, the N-type semiconductor areas 57, formed into a plurality of stripes in one direction, are formed on an upper portion of the P-type semiconductor substrate 51, and the gate electrodes 59, formed into a plurality of stripes that extend perpendicular to these N-type semiconductor areas 57 through a gate oxidation film 58, are also installed on the upper portion of the P-type semiconductor substrate 51. Memory cells are placed at intersections between the N-type semiconductor areas 57 and the gate electrodes 59.

Source areas and drain areas, made of the adjacent N-type semiconductor areas 57, are located below the respective gate electrodes 59, and operation channels 54 are formed between the source areas and the drain areas. In the case when the threshold voltage of each operation channel 54 is preliminarily set to a predetermined value for each portion, upon application of a voltage not less than the predetermined value to the gate electrodes 59 through word lines A1, A2 . . . , the operation channels 54 are allowed to conduct, and electrons are allowed to shift from the source side toward the drain side (in this case, bit lines f1, f2 . . . , have been preliminarily set so as to satisfy drain voltage>source voltage); thus, a drain current is allowed to flow. Consequently, the writing process for information "1" is carried out.

In other words, when a positive voltage is applied to the gate electrodes 59, in the operation channel 54, a positive hole of the P-type semiconductor substrate 51 is pushed inward, and in contrast, a negative charge that is an electron is induced. When the positive voltage of the gate electrodes 59 increases, the number of electrons in the operation channel 54 increases, with the result that an N-type transmitting layer is formed, and this allows the source area and the drain area that have the same N-type to conduct, thereby allowing a current to flow. Here, these transistors that form the N-type transmitting layer as the operation channel 54 are referred to as N-channel transistors. In contrast, those transistors that form the P-type transmitting layer as the operation channel 54 are referred to as P-channel transistors.

Here, in the case when boron (B) ions, which form an impurity to Si, are injected into the operation channel 54, since B is trivalent while Si is tetravalent, in this boron (B) ion injected area 55, there is a lack of one electron in order to form a covalent bond with an Si atom. Here, an attempt is made to compensate for the lack of one electron by gaining one electron from an adjacent Si atom so as to complete the covalent bond. As a result, a positive hole is formed at the original Si position.

When the concentration of boron (B) ions in the operation channel 54 is made high, the number of positive holes increases, with the result that even upon application of a predetermined positive voltage to the gate electrode 59 as described above, there is no increase in the number of electrons. This makes it possible to write information "0".

In other words, in the mask ROM, data is fixed at the time of manufacturing a device. Therefore, as described above, when an attempt is made to write "0" upon application of a predetermined voltage, boron (B) ions are preliminarily injected into the operation channel 54 at a high concentration at the time of the manufacturing process thereof.

However, in the above-mentioned semiconductor device, as illustrated in FIG. 7(a), the mask ROM of the NOR type needs 2F in the lateral direction pitch X per bit, and also needs 2F in the longitudinal direction pitch Y per bit, in the case of design rule F. For this reason, the area of the mask ROM of the NOR type occupies $4F^2$ per bit, raising problems in achieving a small-size, highly integrated device.

Here, F in the above-mentioned design rule F refers to a dimension, for example, given as F=0.25 μm.

SUMMARY OF THE INVENTION

The objective of the present invention is to provide a semiconductor device which can achieve a small-size, highly integrated device by minimizing a separation area between respective elements in a transistor.

In order to achieve this objective, the semiconductor device of the present invention is provided with:

a first conduction type semiconductor substrate having a plurality of first conduction type semiconductor areas and a plurality of second conduction type semiconductor areas that are alternately formed adjacent to each other;

a first transistor having a source area and a drain area that are the second conduction type semiconductor areas and a channel section that is the first conduction type semiconductor area located between these;

a second transistor having a source area and a drain area that are the first conduction type semiconductor areas and a channel section that is the second conduction type semiconductor area located between these, the source or drain area being formed adjacent to the first transistor so as to serve as the channel section of the first transistor in a shared manner, one of the first and second transistors having a reversely biased coupling between the first and the second conduction type semiconductor areas while the other transistor is being operated.

With the above-mentioned arrangement, the first transistor and the second transistor are formed adjacent to each other on the first conduction type semiconductor substrate, and the channel section of the first transistor also serves as the source or drain area of the second transistor. However, in the case when transistors are simply placed adjacent to each other, current leakage might occur between the transistors.

For this reason, in conventional semiconductor devices, an element separation area is formed between the transistors so as to prevent current leakage. This needs to maintain an element separation area having a sufficient size, making it impossible to achieve a small-size, highly integrated semiconductor device.

In contrast, in the above-mentioned arrangement of the present invention, the first and second transistors are formed adjacent to each other, and in addition to this, in the transistor that is not being operated, the junction between the first and second conduction type semiconductor areas is reversely biased.

In other words, for example, while electrons are flowing from the source area to the drain area of the first transistor, a voltage lower than that of the drain area is applied to the area forming a junction with the drain area in the second transistor. Therefore, it is possible to avoid electrons from flowing out of the drain area, and consequently to positively prevent current leakage.

As described above, since the semiconductor device of the present invention has a construction for positively preventing current leakage between transistors without the need for installing an element separation area between transistors, it becomes possible to achieve further miniaturization and high integrity in the semiconductor device.

In other words, in order to achieve the above-mentioned objective, the semiconductor device of the present invention is provided with a plurality of memory cells, each of which has a first MOS transistor and a second MOS transistor having a conduction type different from that of the first MOS transistor that are placed adjacent to each other, and a first conduction type impurity area in a channel section of the first MOS transistor and a first conduction type source area or a first conduction type drain area in the second MOS transistor are commonly used in a shared manner, with the shared area having a junction reversely biased.

With the above-mentioned arrangement, the memory cell is formed with the first MOS transistor and the second MOS transistor being placed adjacent to each other. The semiconductor device has a plurality of memory cells each of which is formed in this manner.

Here, the adjacent first and second MOS transistors need to be separated from each other, and this tends to prevent miniaturization and high integrity. Therefore, in the present semiconductor device, the first conduction type impurity area in a channel section of the first MOS transistor and the first conduction type source area or the first conduction type drain area in the second MOS transistor are commonly used in a shared manner, with the shared area having a junction reversely biased.

This reversely biased state makes it possible to separate the above-mentioned shared area, and consequently to minimize the separation area used for separating the adjacent first and second MOS transistors from each other. Therefore, it becomes possible to provide a semiconductor device which can achieve miniaturization and high integrity.

For a fuller understanding of the nature and advantages of the invention, reference should be made to the ensuing detailed description taken in conjunction with the accompanying drawings.

BRIEF DESCRIPTION OF THE DRAWINGS

FIGS. 1(a), 1(b) and 1(c) show one embodiment of a semiconductor device in accordance with the present invention.

FIGS. 2(a) and 2(b) show manufacturing processes during which an N-type semiconductor area is formed in the semiconductor device.

FIGS. 3(a) and 3(b) show manufacturing processes during which an N-type inert section is formed in the semiconductor device.

FIGS. 4(a) and 4(b) show manufacturing processes during which a first gate electrode is formed in the semiconductor device.

FIGS. 5(a) and 5(b) show manufacturing processes during which a vapor-phase epitaxy oxide film is formed in the semiconductor device.

FIGS. 6(a) and 6(b) show manufacturing processes during which a second gate electrode is formed in the semiconductor device.

FIGS. 7(a) and 7(b) show a conventional semiconductor device.

DESCRIPTION OF THE EMBODIMENTS

Figure 1:
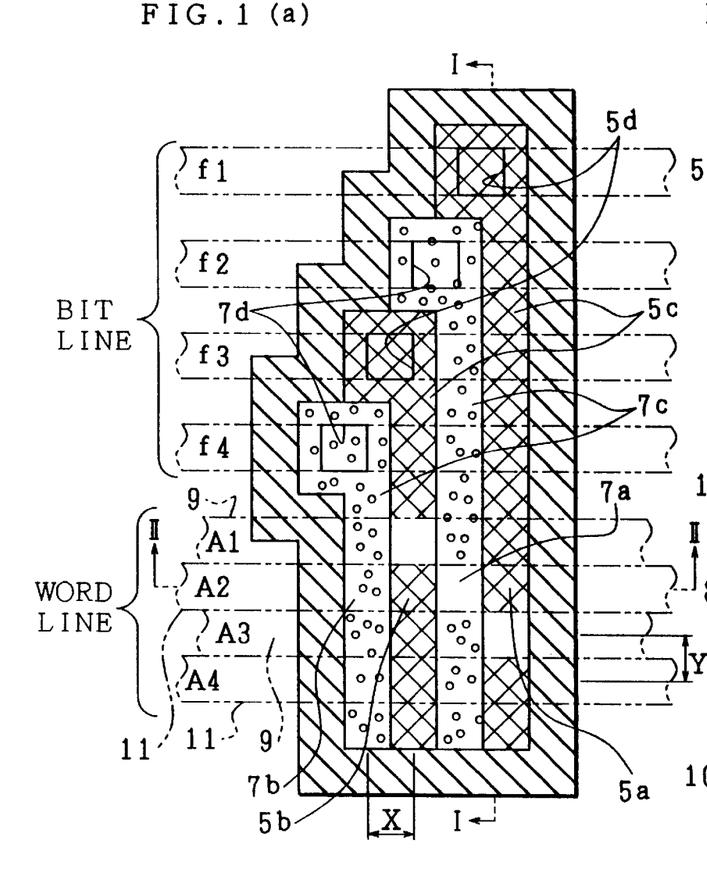
FIG. 1(a) is a plan view.
FIG. 1(b) is a cross-sectional view taken along line I—I of FIG. 1(a)
FIG. 1(c) is a cross-sectional view taken along line II—II of FIG. 1(a).
Figure 5:
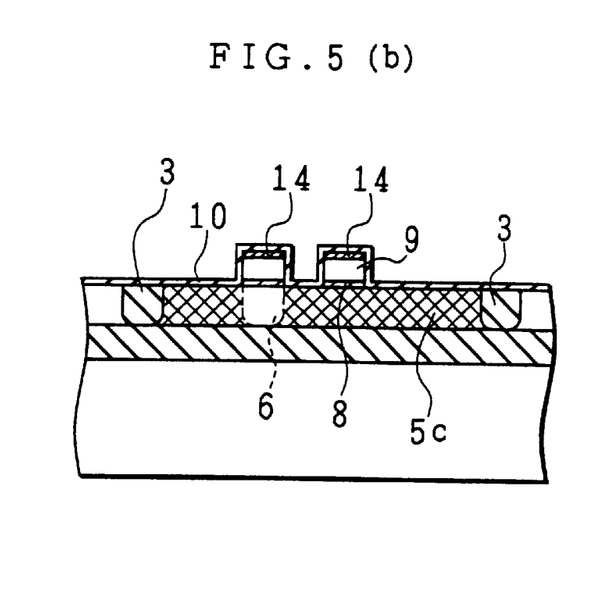
FIG. 5(a) is a cross-sectional view taken along line II—II of FIG. 1(a)
FIG. 5(b) is a cross-sectional view taken along line I—I of FIG. 1(a).
Figure 6:
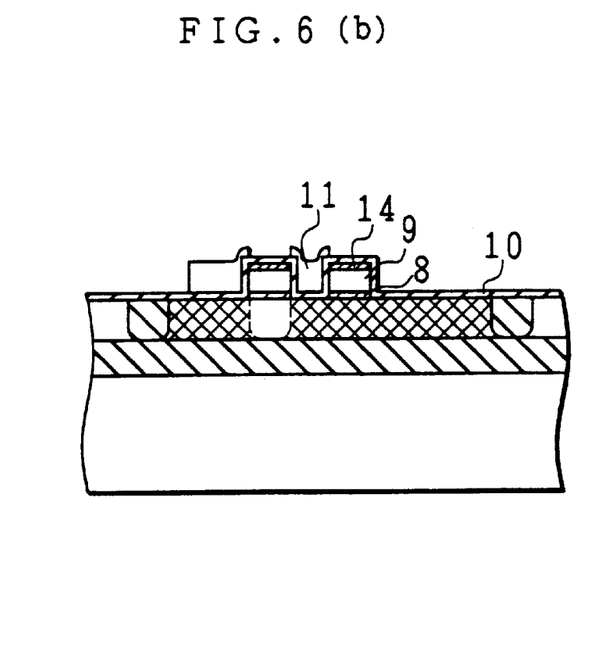
FIG. 6(a) is a cross-sectional view taken along line II—II of FIG. 1(a)
FIG. 6(b) is a cross-sectional view taken along line I—I of FIG. 1(a).

Referring to FIGS. 1(a) (b) (c) through FIGS. 6(a) (b), the following description will discuss one embodiment of the present invention.

The semiconductor device of the present invention forms a NOR-type mask ROM that carries out information writing with high density channels by using ion injection, and a second transistor array having a different polarity from a first transistor array is formed adjacent to the first transistor array so as to always apply a reverse bias to the PN junction and to separate the elements, thereby making it possible to eliminate an element separation area between transistors. Here, the NOR-type is used in this semiconductor equipment; however, not limited to this type, for example, the NAND-type, etc. may be used.

Moreover, the source and drain wiring areas of the first transistor array are highly integrated by sharing the channel area with the second transistor array having a different polarity from the first transistor array.

In other words, in the semiconductor device of the present invention, N-type transistor rows and P-type transistor rows are alternately placed so that the element separation is carried out by applying a reverse bias to the PN junction without installing an element separation area in a separate manner. Consequently, all the areas can be used as channels, and the cell area can be reduced.

That is, as illustrated in FIGS. 1(a), 1(b) and 1(c), respective elements are formed on a P-type SOI (Silicon on Insulator) substrate 20 made of P-type silicon (Si) serving as a first conduction-type semiconductor substrate.

The above-mentioned P-type SOI substrate 20 is constituted by a P-type semiconductor (Si) substrate 1, an Si oxide film layer 2 as a buried oxide film, and a P-type silicon (Si) layer 4 consisting of a P-type semiconductor serving as a first conduction-type impurity area. SOI will be described later in detail.

On the P-type silicon (Si) layer 4 of the above-mentioned P-type SOI substrate 20, a plurality of N-type sources 5b as the second conduction-type source areas and a plurality of N-type drains 5a as the second conduction-type drain areas, which are N-type semiconductor areas serving as second conduction-type impurity areas, are formed in parallel with each other. For convenience of explanation, the present embodiment exemplifies a case in which a pair of N-type source 5b and N-type drain 5a are supposedly provided.

Moreover, a plurality of P-type semiconductor areas, left as the first conduction-type impurity areas, are located in a channel section between the N-type source 5b and the N-type drain 5a on the P-type silicon (Si) layer 4 of the P-type SOI substrate 20. In the case when information "0" is written in these P-type semiconductor areas, P-type impurities, such as boron fluoride (BF) and boron (B) ions, are injected thereto with high density. Here, in the case when information "1" is written therein, it is not necessary to inject P-type impurities with high density.

In the present embodiment, these N-type source 5b, N-type drain 5a and the P-type semiconductor area constitute an N-channel transistor A serving as a first transistor (first MOS transistor, N-channel MOS transistor). Here, a P-type drain 7a, which will be described later, is used as the P-type semiconductor area.

Here, P-type semiconductor areas, on both of the sides of the N-type source 5b and N-type drain 5a, that is, in FIG. 1(c) on the respective left sides of the N-type source 5b and the N-type drain 5a, P-type semiconductor areas, left in parallel with each other, are utilized as a P-type source 7b serving as a first conduction-type source area and a P-type drain 7a serving as a first conduction-type drain area.

Moreover, these P-type source 7b, P-type drain 7a and channel section between the P-type source 7b and the P-type drain 7a constitute a P channel transistor B serving as a second transistor (second MOS transistor, P-channel MOS transistor).

Here, in some cases, N-type impurities are further injected to the channel section between the P-type source 7b and P-type drain 7a, that is, the N-type source 5b, with high density, depending on the contents of information.

As described above, in the present embodiment, a memory cell is formed in which the N-channel transistors A and the P-channel transistors B, having respectively different conduction-types, are fitted alternately.

Moreover, as illustrated in FIG. 1(b), on the upper side of the P-type SOI substrate 20, a first gate oxide film 8 and a second gate oxide film 10 are formed as gate insulation films, and on the upper side of these first gate oxide film 8 and second gate oxide film 10 are formed first gate electrodes 9 and second gate electrodes 11 serving as a plurality of gate electrodes formed in a manner so as to overlap P-type source 7b and P-type drain 7a and the N-type source 5b and the N-type drain 5a. Thus, these P-type source 7b, P-type drain 7a, N-type source 5b and N-type drain 5a, as well as the first gate electrodes 9 and second gate electrodes 11, constitute a memory cell array.

As illustrated in FIG. 1(a), the first gate electrodes 9 and the second gate electrodes 11 are used as word lines A1 to A4.

In other words, as illustrated in FIGS. 1(a) and 1(c), word lines A1 to A4 are wired above the N-type source 5b and N-type drain 5a as well as the P-type drain 7a and P-type source 7b; thus, the word lines A1 and A3 are formed above the N-type source 5b and N-type drain 5a, and used as the gate of P-channel transistor B, and the word lines A2 and A4 are formed above the P-type drain 7a and P-type source 7b, and used as the gate of the N-channel transistor A. Moreover, upon change in the selection condition of the ROM, the word lines A1 and A3 serve as the gate of the N-channel transistor A, and the word lines A2 and A4 serve as the gate of the P-channel transistor B.

Moreover, as illustrated in FIG. 1(b), the first gate electrode 9 and the second gate electrode 11 form two layers with the second gate oxide film 10 interpolated between them; thus, the transistor array is arranged so that even if the adjacent first gate electrode 9 and the second gate electrode 11 are closely located, they are respectively connected to the N-type source 5b and the N-type drain 5a as well as the P-type source 7b and the P-type drain 7a. without shortcircuiting.

Moreover, as illustrated in FIGS. 1(a) and 1(b), electrode extension wiring sections 5c and 7c, which are constituted by semiconductors and serve as bit diffusion lines, are respectively formed in a manner so as to extend in one direction from the N-type source 5b and N-type drain 5a as well as from the P-type source 7b and the P-type drain 7a (the upward direction in FIG. 1(a)), and short-cut connected to bit lines f1 to f4 which are made of metal wiring and placed in parallel with the word lines A1 to A4, through electrode extension use windows 5d and 7d.

The data writing process in the above-mentioned memory cell array is carried out by a method as described below. In the present embodiment, the semiconductor device, provided as a ROM, is only used for reading information, and the data writing process is carried out at the time of the manufacturing process.

First, in the N-channel transistor A, only to the P-type drain 7a that is the P-type semiconductor area in the P-type SOI substrate 20 below the first gate electrode 9 and the second gate electrode 11, impurity ions of P-type that is the same type as the P-type SOI substrate 20 are selectively injected with high density; thus, the data writing process is carried out by selectively increasing the threshold value of the N-channel transistor A.

Then, in the P-channel transistor B, only to the N-type source 5b that is the N-type semiconductor area in the P-type SOI substrate 20, impurity ions of N-type that is the same type as the N-type source 5b are selectively injected with high density; thus, the data writing process is carried out by selectively increasing the threshold value of the P-channel transistor B.

Moreover, in the present embodiment, voltage application at the time of the data reading process is carried out as described below.

First, during an operation in which the N-channel transistor A having the N-type source 5b and the N-type drain 5a that are the N-type semiconductor areas are selected, a reverse bias state is provided in the coupling (junction) between the N-type source 5b and the P-type source 7b and the P-type drain 7a of the P-channel transistor B that are adjacent to each other and have mutually different conduction types.

Thus, it becomes possible to prevent a current from flowing to the P-type source 7b and the P-type drain 7a.

In contrast, during an operation in which P-channel transistor B is selected, a reverse bias state is provided in the N-channel transistor A so as to prevent the occurrence of current leakage.

More specifically, when the P-channel transistor B is selected, a voltage is applied so as to make the P-type drain 7a negative to the P-type source 7b. Thus, positive holes flow from the P-type source 7b to the P-type drain 7a, thereby allowing a current to flow from the P-type source 7b to the P-type drain 7a. In this case, in the N-channel transistor A having the adjacent mutually different conduction types, since the reverse bias state is provided in the coupling (connection) between the P-type drain 7a and the N-type source 5b and the N-type drain 5a, it is possible to prevent the occurrence of current leakage.

That is, in the semiconductor device of the present embodiment, while one of the first and the second transistors (N-channel transistor A and P-channel transistor B) is being operated, the reverse bias is provided in the coupling (PN junction) of the first and second conduction-type semiconductor areas.

Moreover, the present embodiment is arranged so that, of the first gate electrode 9 and the second gate electrode 11, the gate electric potential of the selected gate electrode is changed so as to allow the channel sections to conduct, while the gate electric potential of the non-selection gate electrode is also changed so as to maintain the channel sections in a non-conduction state and consequently to allow the bit line section without a high-density diffusion to conduct.

In other words, the non-selection gate electrode also is arranged to lower its gate electric potential so that it becomes possible to prevent the occurrence of current leakage, and also to provide a thin formation of the first gate oxide film 8.

Next, an explanation will be given of a manufacturing method of the above-mentioned semiconductor device.

Figure 2:
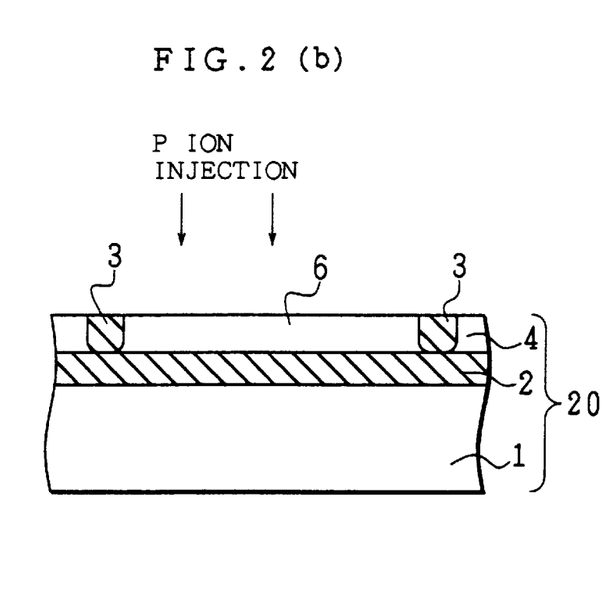
FIG. 2(a) is a cross-sectional view taken along line II—II of FIG. 1(a)
FIG. 2(b) is a cross-sectional view taken along line I—I of FIG. 1(a).

In the present embodiment, as illustrated in FIGS. 2(a) and 2(b), by using the SOI technique, an Si oxide film layer 2 is formed in the P-type semiconductor (Si) substrate 1 in its shallow portion in a range from 20 to 200 nm of its surface layer by ion injection or lamination, or other methods, and on this is further formed a P-type silicon (Si) layer 4 consisting of a P-type semiconductor. Thus, the P-type SOI substrate 20, constituted by the P-type semiconductor (Si) substrate 1, the Si oxide film layer 2 and the P-type silicon (Si) layer 4, is provided.

Here, the above-mentioned SOI refers to a technique for forming a single crystal of silicon on an insulating material; and more specifically, it includes a method in which, as described above, an Si oxide film layer 2 serving as an insulator is ion-injected, not to a surface layer of the P-type semiconductor (Si) substrate 1, but to the inside thereof and this is annealed to form a P-type silicon (Si) layer 4 on its upper portion, a method in which an Si oxide film layer 2, which is a thermo oxide film layer, is formed on a P-type semiconductor (Si) substrate 1 and the Si oxide film layer 2 is allowed to contact the surface of another P-type semiconductor (Si) substrate 1 by laminating these two substrates and this is then thinned by cutting and grinding the surface section of the other P-type semiconductor (Si) substrate 1, and other methods.

The feature of the SOI technique is that even if the distance between adjacent elements is narrowed, the occurrence of current leakage can be prevented. More specifically, in the case when elements, such as N-type source and drain, are closely formed on the surface side of the above-mentioned P-type semiconductor (Si) substrate 1 without forming the Si oxide film layer 2 serving as an insulator, since the P-type semiconductor (Si) substrate 1 is a semiconductor, an extra electric current tends to flow below the gap between the adjacent elements. However, when the Si oxide film layer 2 serving as an insulator is formed below the adjacent elements as in the case of SOI, such current leakage can be prevented. Consequently, the SOI technique makes it possible to achieve high integrity, and to form ICs and LSIs having elements aligned with narrowed gaps.

Next, insulation separation oxide films 3 are formed on the P-type silicon (Si) layer 4 as separation insulation films; thus, element separation in a lateral direction is carried out. This technique is generally referred to as an insulation separation technique in which the element separation in a lateral direction is carried out by using an insulator. Additionally, other insulation separation techniques, such as LOCOS separation, trench separation and space separation, have been known.

Next, in the P-type silicon (Si) layer 4 on the upper side of the Si oxide film layer 2, phosphor (P) ions are injected to and dispersed in a portion that is to form channel sections in the memory cell and N-channel transistor A of a peripheral circuit which will be described later; thus, an N-type semiconductor area 6 is formed.

Figure 3:
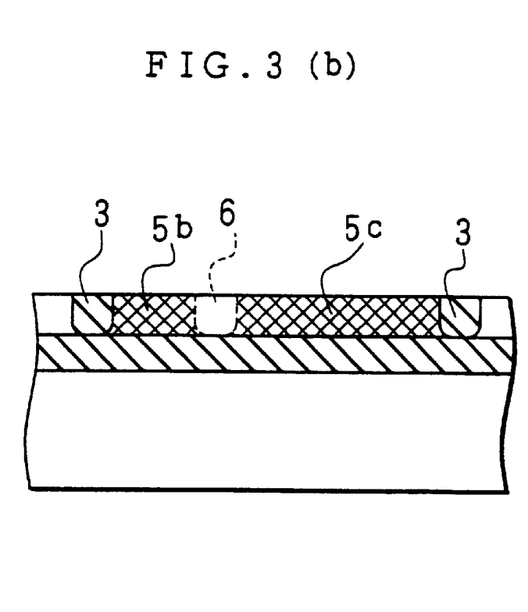
FIG. 3(a) is a cross-sectional view taken along line II—II of FIG. 1(a)
FIG. 3(b) is a cross-sectional view taken along line I—I of FIG. 1(a).

Then, as illustrated in FIGS. 3(a) and 3(b), arsenic (As) or phosphor (P) ions are injected to and dispersed in the electrode extension wiring section 5c of the N-channel transistor A in the memory cell and the N-type source 5b of the N-channel transistor A to form an N-type inert section of the P-channel transistor B used for writing ROM information; thus, an N-type high-density area is formed. More specifically, any of arsenic (As) and phosphor (P) ions has a valence of 5, and since Si has a valence of 4, it releases one excessive electron when allowed to form a covalent bond with an Si atom. Therefore, the injection and dispersion of arsenic (As) or phosphor (P) ions forms an N-type. Moreover, the above-mentioned N-type inert section has a high concentration of impurities such as arsenic (As) or phosphor (P) ions with respect to Si, it forms a portion that is always maintained OFF even when a voltage is applied to the first gate electrode 9 and the second gate electrode 11. Hence, it has the name, the inert section.

Moreover, the reason that arsenic (As) or phosphor (P) ions are injected to and dispersed in the electrode extension wiring section 5c is because it is necessary to increase the concentration of electrons in order to allow a current to easily flow through the electrode extension wiring section 5c.

Next, as illustrated in FIGS. 1(a) and 1(c), boron fluoride (BF) or boron (B) ions are injected to and dispersed in the electrode extension wiring section 7c of the P-channel transistor B in the memory cell and the P-type source 7b of the P-channel transistor B to form a P-type inert section of the N-channel transistor A used for writing ROM information; thus, an P-type high-density area is formed. More specifically, boron has a valence of 3, and since Si has a valence of 4, it lacks one electron when allowed to form a covalent bond with an Si atom. Therefore, the injection and dispersion of boron fluoride (BF) or boron (B) ions forms a P-type. Here, in the present embodiment, with respect to the P-type drain 7a shown in FIGS. 1(a) and 1(c), the injection of boron fluoride (BF) or boron (B) ions is not carried out.

However, since this area, that is, the area of the P-type drain 7a, is originally provided as a P-type silicon (Si) layer 4, the P-type is maintained. Additionally, when an attempt is made to provide this area as a P-type inert section, the injection of boron (B) ions, etc., with high concentration may be carried out.

Moreover, the reason that boron fluoride (BF) or boron (B) ions are injected to and dispersed in the electrode extension wiring section 7c is because it is necessary to increase the concentration of positive holes in order to allow a current to easily flow through the electrode extension wiring section 7c.

Figure 4:
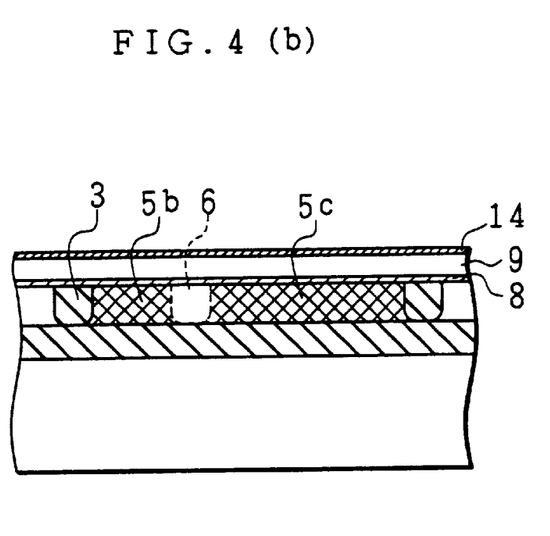
FIG. 4(a) is a cross-sectional view taken along line II—II of FIG. 1(a)
FIG. 4(b) is a cross-sectional view taken along line I—I of FIG. 1(a).

Next, as illustrated in FIGS. 4(a) and 4(b), the first gate oxide film 8 is formed on the P-type silicon (Si) layer 4, and on this is formed the first gate electrode 9 made of, for example, polysilicon, titanium silicon (TiSi) or tungsten silicon (WSi), etc., and on this is further formed a vapor-phase epitaxy oxide film 14.

Thereafter, the above-mentioned first gate oxide film 8, the first gate electrode 9 and the vapor-phase epitaxy oxide film 14 are subjected to a photo-etching process in their predetermined areas, and as illustrated in FIGS. 5(a) and 5(b), a second gate oxide film 10 is allowed to glow on the surface thereof as a gate insulating film and an insulating film.

Next, as illustrated in FIGS. 6(a) and 6(b), polysilicon, tungsten silicon or titanium silicon are allowed to grow thereon, and subjected to a photo-etching so that the second gate electrode 11 is formed.

By using the second gate electrode 11 as a mask. As ions are injected to the N-type source 5b and the N-type drain 5a of the peripheral N-channel transistor A for use in peripheral circuit source and drain, and boron fluoride (BF) or boron (B) ions are injected to the P-type source 7b and the P-type drain 7a of the peripheral P-channel transistor B, and these are subjected to a salicide process, if necessary, so as to form respective high-density areas 12 and 13.

Here, in the above-mentioned manufacturing process, the material of the first gate electrode 9 is not intended to be limited by a doped polysilicon single layer, a refractory (high-melting-point) metal, silicide or salicide, etc.

Moreover, with respect to the high-density ion injection for the source and drain of the memory cell, for the inactivation of the transistor for writing ROM information and for the electrode extension wiring sections 5c and 7c, the ion injection may be carried out simultaneously with the input of ROM information by high-voltage ion injection through the first gate electrode 9 after the formation of the first gate electrode 9 and the second gate electrode 11, in order to respond to a short due date after obtaining the ROM information.

Thereafter, on the above-mentioned processed product, an inter-layer insulating film, such as an NSG and a BPSG, not shown, is formed, and after forming electrode extension windows 5d and 7d at intersections between bit lines f1 to f4 and the electrode extension wiring sections 5c and 7c shown in FIG. 1(a), metal wiring of one layer is affixed to each of the bit lines f1 to f4, thereby completing the process.

Here, the bit lines f1 to f4 are placed on one side (on the upper side on the drawing of FIG. 1(a)) with respective layers aligned in parallel with each other; however, the present invention is not intended to be limited by this arrangement.

In other words, in the case when the word lines A1 . . . and the bit lines f1 . . . are aligned in the same direction and wired as described above, if there are a number of bit lines f1 to f4 . . . fn (n: integer), the electrode extension wiring sections 5c and 7c for the bit line fn at the end becomes long, resulting in an increase in the resistance of the extension wiring. In other words, since the electrode extension wiring sections 5c and 7c are formed by semiconductors, their resistance is greater as compared with other conductors such as metal. Such greater resistance in the extension wiring gives adverse effects on the transfer speed.

Here, in order to reduce the wiring resistance of the electrode extension wiring sections 5c and 7c, it is possible to extend the electrode extension wiring sections 5c and 7c in both of the directions (both of the upward and downward directions in FIG. 1(a)). Thus, even for the bit line fn at the end, the length of the electrode extension wiring sections 5c and 7c can be reduced to virtually half as compared with a case in which it is extended in one direction.

In contrast, another acceptable arrangement is such that the first gate electrode 9 and the second gate electrode 11 are placed on both of the ends of the P-type SOI substrate 20 (on both of the sides in the upward direction and the downward direction in FIG. 1(a)) and the electrode extension wiring sections 5c and 7c are extended toward the intermediate portion on the P-type SOI substrate 20, thereby short-circuiting the gate electrodes and the bit lines f1 to f4 . . . fn. This arrangement also makes it possible to reduce the length of the electrode extension wiring sections 5c and 7c to virtually half.

Moreover, the bit lines f1 to f4 are placed with respective layers aligned in parallel with each other; however, the present invention is not intended to be limited by this arrangement, and as another method, multiple layers such as two layers may be placed through an insulating layer. This arrangement also makes it possible to reduce the distance of the electrode extension wiring sections 5c and 7c to virtually half. Here, in the case of the two layers, the two layers are not necessarily arranged to overlap with each other completely; and they may have only a partially overlapped portion.

As illustrated in FIGS. 1(a), 1(b) and 1(c), in the case of the design rule F (F=0.25 $\mu$m), pitches for one bit are Fs in the longitudinal pitch X and in the lateral pitch Y; and the area is represented by $F^2$, which makes it possible to achieve miniaturization and high integrity to 1/4 as compared with conventional memory cells.

Next, Table 1 shows one example of bias conditions at the time of data reading in the semiconductor device of the present embodiment. Here, these bias conditions are the same as those used at the time of writing in the voltage application method to the N-type source 5b and the N-type drain 5a of the N-channel transistor A as well as to the P-type source 7b and the P-type drain 7a of P-channel transistor B and those used in the voltage application method to the first gate electrode 9 and the second gate electrode 11; however, in this case, an explanation will be given by means of specific numeric values.

In the following example, the N-type source 5b and the N-type drain 5a are not necessarily in a fixed state. In other words, since the two are equal to and symmetric with each other in construction, they can be exchanged to form an N-type source 5a and an N-type drain 5b. Therefore, in the following example, an explanation will be given by referring the areas of 5a and 5b in FIG. 1(c) to an N-type source 5a and an N-type drain 5b. However, with respect to P-type source 7b and P-type drain 7a, the explanation will refer to the same areas as described before.

First, by setting the concentration of impurities in the channel section of a memory cell, the threshold voltage of the N-channel transistor A is set to 0.5 V, the P-type inert section 7a is set to have a threshold voltage of not less than 1V by injection of ions used for writing ROM information, the P-channel transistor B is set to have a threshold value of −0.5 V, and the N-type source 5b serving as an N-type inactive section is set to have a threshold value of not more than −1V by injection of ions used for writing ROM.

Here, all the threshold values are values with respect to the voltage of the channel section obtained in a state where a reverse bias is applied to the source and the drain.

Moreover, in Table 1, A1, A2, A3 and A4 represent the word lines A1 to A4 in the NOR-type memory cell, and f1, f2, f3 and f4 represent the bit lines f1 to f4.

TABLE 1

Bias conditions at the time of data readout (unit: V)

|  |  | A1 | A2 | A3 | A4 | f1 | f2 | f3 | f4 |
|---|---|---|---|---|---|---|---|---|---|
| A Readout | Condition 1 | 1 | 1 | 1 | 1 | 0 | −1 | 0 | −1 |
|  | Condition 2 | 0 | 1 | 1 | 1 | 0 | −1 | 0 | −1 |
|  | Condition 3 | 1 | 0 | 1 | 1 | 0 | −1 | 1 | −1 |
|  | Condition 4 | 1 | 1 | 0 | 1 | 0 | −1 | 0 | −1 |
|  | Condition 5 | 1 | 1 | 1 | 0 | 0 | −1 | 0 | −1 |
| B Readout | Condition 6 | −1 | −1 | −1 | −1 | 1 | 0 | 1 | 0 |
|  | Condition 7 | 0 | −1 | −1 | −1 | 1 | −1 | 1 | 0 |
|  | Condition 8 | −1 | 0 | −1 | −1 | 1 | 0 | 1 | 0 |
|  | Condition 9 | −1 | −1 | 0 | −1 | 1 | 0 | 1 | 0 |
|  | Condition 10 | −1 | −1 | −1 | 0 | 1 | 0 | 1 | 0 |

First, as shown in conditions 1, 2, 4 and 5, as an example of a reading process from the ROM in the N-channel transistor A, the bit line f1 is fixed to 0V that is the ground voltage, and the word line A2 is set to 1V. Thus, a positive voltage greater than the threshold voltage 0.5 V of the N-channel transistor A is applied, the N-channel transistor A is allowed to conduct, electrons shift from the N-type source 5a to the N-type drain 5b, and the bit line f3 becomes 0V that is the same as the bit line f1. In this case, the bit lines f2 and f4 are set to −1 to 0V so as to prevent current leakage, and a reverse bias state is provided in the PN junction so as to separate the elements. In other words, in Table 1, both of the bit lines f2 and f4 are set to −1 V. In this case, the N-type drain 5b of the N-channel transistor A is set to either 1 V at the initial value or to 0 V at the power application time, and the P-type source 7b and the P-type drain 7a, which are areas adjacent thereto, are set to −1 V. Therefore, since the P-type source 7b and the P-type drain 7a are always maintained in a reverse bias state with respect to the N-type drain 5b, no electrons are allowed to shift from areas other than the channel area of the N-channel transistor A. That is, electrons are not allowed to flow from the N-type drain 5b set at 1 V or 0 V to the P-type source 7b and the P-type drain 7a set at −1 V. Moreover, at one portion of the bit line f3 formed by the N-type high-density diffusion, there is a place having no high-density diffusion. However, the non-selection word line A1 becomes 1V, and serves as the gate of the transistor constituted inside the bit line, thereby providing a conductive state.

Next, in the case when the word line A2 is set to 0 V or −1V in the above-mentioned conditions 1, 2, 4 and 5, since a voltage smaller than the threshold voltage 0.5 V is applied, the bit line f1 is allowed to maintain the initial value 1 V as indicated by condition 3, with the N-channel transistor A being in the OFF state.

Here, in the case when high-concentration ions of the P-type have been injected to the channel section of each of the other N-channel transistors A within the same bit line f3, all the N-channel transistors A are maintained in the off state independent of the states of the word lines A1, A3 and A4 other than the word line A2; thus, the bit line f3 is allowed to maintain the initial value, 1V.

As an example of a reading process from the ROM of the P-channel transistor B, the bit line f4 is fixed to the ground voltage 0V, while the word line A1 is set to −1 V, as indicated by the conditions 6, 8, 9 and 10. With this arrangement, since a negative voltage greater than the threshold voltage −0.5 V of the P-channel transistor B is applied, the P-channel transistor B is allowed to conduct, with the result that positive holds flow from the P-type source 7b to the P-type drain 7a so that the bit line f2 is set to 0 V that is the same as the bit line f4. At this time, the bit lines f1 and f3 are set to 1 to 0 V so as to prevent current leakage and the PN junction is set in the reverse bias state so as to separate the elements. In other words, in Table 1, both of the bit lines f3 and f1 are set to 1 V. In this case, the P-type drain 7a of the P-channel transistor B is set either to −1 V that is the initial value or to 0 V at the time of power application, and the N-type source 5a and the N-type drain 5b, which are the adjacent areas, are set to 1 V. Therefore, since the N-type source 5a and the N-type drain 5b are always set in a reverse bias state with respect to the P-type drain 7a, no positive holes are allowed to shift from the areas other than the channel area of the P channel transistor B, thereby causing no current leakage. In other words, no positive holes are allowed to flow from the P-type drain 7a set at −1 V or 0 V to the N-type source 5a or the N-type drain 5b that is set at 1 V.

Next, under the above-mentioned conditions 6, 8, 9 and 10, in the case when the word line A1 is set to 0 V or 1 V, since a negative voltage smaller than the threshold voltage −0.5 V is applied thereto as shown in condition 7, the bit line f2 is maintained at the initial value −1 V, and the P-channel transistor B is set in the off state.

Here, in the case when high-concentration ions of the N-type have been injected to the channel section of each of the other P-channel transistors B within the same bit line f2, all the transistors are maintained in the off state independent of the states of the word lines A2, A3 and A4 other than the word line A1; thus, the bit line f2 is allowed to maintain the initial value, −1V.

Additionally, the above-mentioned explanation only shows one operational example of the memory cell; therefore, the operating voltage, the threshold voltages, etc. are not intended to be limited by the present embodiment, and various modifications may be made within the scope of the present invention.

As described above, in the semiconductor device of the present embodiment, the N-channel transistor A is constituted by the N-type source 5b, the N-type drain 5a and the P-type semiconductor area of the P-type silicon (Si) layer 4 located at the channel section between these N-type source 5b and N-type drain 5a.

Moreover, a P-type drain 7a is formed by utilizing the channel section of the N-channel transistor A, and the P channel transistor B is constituted by this P-type drain 7a, the P-type source 7b and the N-type drain 5a located at the channel section between the P-type source 7b and P-type drain 7a.

In other words, in the present embodiment, the memory cell is formed by alternately fitting transistors having different conduction types. Therefore, the P-type semiconductor area of the P-type silicon (Si) layer 4 in the channel section of the N-channel transistor A and the P-type drain 7a in the channel section of the P-channel transistor B are commonly used in a shared manner.

Then, a memory cell array is constructed by a plurality of first gate electrodes 9 and second gate electrodes 11 that are formed in a manner so as to overlap the respective N-type sources 5b and N-type drains 5a as well as the P-type sources 7b and P-type drains 7a in the N-channel transistors A and the P-channel transistors B.

Moreover, in the channel sections of the N-channel transistor A and the P-channel transistor B, each of the channel sections is allowed to have a high concentration by injecting impurity ions that have the same conduction type as the channel section in order to carry out a writing process of predetermined data, for example, "0". With this arrangement, the threshold value of the N-channel transistor A or the P-channel transistor B is selectively made higher. For this reason, upon application of a predetermined voltage to the first gate electrode 9 or the second gate electrode 11, with respect to the area in which the channel section has a high concentration by the injection of impurity ions, for example, information "0" can be written since no current flows, while in the channel section in which no impurity ions are injected, for example, information "1" can be written since a current flows upon application of a predetermined voltage to the first gate electrode 9 or the second gate electrode 11.

Moreover, in the present embodiment, a reverse bias state is always maintained at the junction between the adjacent N-type source 5b and P-type drain 7a so that the N-type source 5b and the P-type drain 7a are separated.

More specifically, during an operation in which the N-channel transistor A having the N-type source 5b and the N-type drain 5a as constituent elements is selected, the junction between the P-type source 7b and the P-type drain 7a of the P-channel transistor B that are adjacent to each other with different conduction types is set in a reverse bias state, while, during an operation in which the P-channel transistor B is selected, the N-channel transistor A is set in a reverse bias state.

With this arrangement, it becomes possible to prevent the occurrence of current leakage, and consequently to positively separate the N-type source 5b and the P-type drain 7a.

As described above, in the present embodiment, the memory cell is formed by alternately fitting the N-channel transistors A and the P-channel transistors B that have different conduction types, and the P-type semiconductor area of the P-type silicon (Si) layer 4 in the channel section of the N-channel transistor A and the P-type drain 7a in the channel section of the P-channel transistor B are commonly used in a shared manner; thus, it is possible to achieve high integrity.

As a result, the separation area between the respective elements in the P-channel transistor B and the N-channel transistor A can be minimized, thereby making it possible to provide a semiconductor device which can achieve miniaturization and high integrity.

Moreover, in the semiconductor device of the present embodiment, the gate electrodes are constituted by a plurality of first gate electrodes 9, and a plurality of second gate electrodes 11 each of which is placed between the first gate electrodes 9 so as to be adjacent thereto, and stacked through the first gate electrode 9 and a second gate oxide film 10. Here, the first gate electrode 9 and the second gate electrode 11 may be stacked in a partially overlapped state through the second gate oxide film 10.

Furthermore, of the first gate electrode 9 and the second gate electrode 11, the selected gate electrode allows each channel section to conduct by changing the gate electric potential, and the non-selection gate electrode is also operated so as to provide a non-conduction state by changing the gate electric potential.

That is, for example, in the case when the gate electric potential of the non-selection gate electrode is lowered so as to be set in a non-conduction state with the result that when the gate electrodes adjacent to the non-selection gate electrode are set in a selected state, the non-selection gate electrode in the non-conduction state serves as a non-active area, thereby making it possible to prevent current leakage between the elements.

For this reason, without the need for thickening the second gate oxide film 10 interpolated between the first gate electrode 9 and the second gate electrode 11, or for widening the distance between the first gate electrode 9 and the second gate electrode 11, it is possible to sufficiently separate the elements.

As a result, the separation area between the respective elements in the N-channel transistor A and the P-channel transistor B can be minimized, thereby making it possible to provide a semiconductor device which can achieve miniaturization and high integrity.

Moreover, in the semiconductor device of the present embodiment, the above-mentioned memory cell array is formed within a silicon layer that is enclosed by the Si oxide film layer 2 formed on the P-type SOI substrate 20 and the insulation separation oxide films 3 that are plated on the top thereof.

This arrangement makes it possible to ensure the separation between the adjacent elements, and consequently to positively prevent current leakage between the adjacent elements; thus, it becomes possible to ensure the separation between the N-channel transistor A and the P-channel transistor B and the portions beneath these transistors, and consequently to positively prevent current leakage from the N-channel transistor A and the P-type transistor B downward.

Moreover, in the semiconductor device of the present embodiment, each of the first gate electrode 9 and the second gate electrode 11, made of metal wiring, is placed as two layers with the second gate oxide film 10 interpolated in between.

Here, the two layers are not necessarily overlapped with each other completely, and may be partially overlapped with each other.

Therefore, upon wiring the first gate electrodes 9 and the second gate electrodes 11, even when the gap between the adjacent first gate electrode 9 and second gate electrode 11 is small, the wiring can be carried out without short-circuiting between the first gate electrodes 9 and the second gate electrodes 11.

Consequently, it becomes possible to achieve miniaturization and high integrity in the semiconductor device.

In the same manner as described above, each of the bit lines f1 to f4 is formed as two layers with an insulating layer interpolated in between. In this case also, even when the gap between the adjacent bit lines f1 to f4 is small, the wiring can be carried out without short-circuiting between the bit lines f1 to f4.

Here, since the electrode extension wiring sections 5c and 7c are formed by semiconductors, their resistance becomes greater, as the distance is lengthened. Therefore, in the case when a number of the electrode extension wiring sections 5c and 7c are placed, if they are extended only in one direction, the resistance of each of the electrode extension wiring sections 5c and 7c connected to the endmost bit line fn becomes greater, thereby giving adverse effects on the transfer speed.

However, in the present embodiment, each of the electrode extension wiring sections 5c and 7c is placed in a manner so as to extend toward both of the ends of the P-type SOI substrate 20, and thus connected to the bit lines f1 to f4, or the first gate electrode 9 and the second gate electrode 11 are placed on the respective ends of the P-type SOI substrate 20 and each of the electrode extension wiring sections 5c and 7c is placed in a manner so as to extend to the intermediate portion of the P-type SOI substrate 20, and thus connected to the bit lines f1 to f4. Consequently, the distance of the extension of each of the electrode extension wiring section 5c and 7c is cut by half.

As a result, it becomes possible to minimize the wiring resistance of the electrode extension wiring sections 5c and 7c, and consequently to provide a high-speed memory cell array.

Moreover, in the semiconductor device of the present embodiment, as described above, each of the bit lines f1 to f4 made of metal wiring may be provided as, for example, two layers with an insulating film, not shown, interpolated in between, so as to be connected to the electrode extension wiring sections 5c and 7c. These two layers are not necessarily overlapped with each other completely, and may be partially overlapped.

As a result, in the same manner as described above, the distance of the extension of each of the electrode extension wiring sections 5c and 7c is cut approximately by half.

Therefore, it becomes possible to minimize the wiring resistance of the electrode extension wiring sections 5c and 7c, and consequently to provide a high-speed memory cell array.

Here, the present invention is not intended to be limited by the above-mentioned embodiments; and various modifications may of course be carried out without departing from the technical scope of the present invention. For example, the first gate electrode 9 and the second gate electrode 11 may have a single-layer structure, or a conventional PN junction well separation may be adopted without using the P-type SOI substrate 20.

As described above, in the semiconductor device of the present invention constituting a memory cell array including a plurality of memory cell transistors, said semiconductor device is provided with a memory cell and a plurality of gate electrodes to form a memory cell array, said memory cell being formed by alternately fitting transistors having different conduction types including a first transistor and a second transistor, said first transistor including: a plurality of second conduction type impurity areas formed on a first conduction type semiconductor substrate in parallel with each other so as to form second conduction type source areas and second conduction type drain areas; and a first conduction type impurity area located in a channel section between the second conduction type source area and the second conduction type drain area on the first conduction type semiconductor substrate, said second transistor including: first conduction type impurity areas that are adjacent to each of the second conduction type impurity areas on both sides in parallel therewith of the first conduction type semiconductor substrate so as to form a plurality of first conduction type source areas and first conduction type drain areas; and a second conduction type impurity area located in a channel between the first conduction type source area and the first conduction type drain area, said plurality of gate electrodes being formed by overlapping the first conduction type impurity areas and the second conduction type impurity areas on the upper side of the gate insulating film formed on the upper side of the first conduction type semiconductor substrate, wherein: impurity ions having the same conduction type as the channel sections are injected to each of the channel sections in the first conduction type semiconductor substrate below the gate electrodes so as to write predetermined data, with a result that the channel sections are made to have high concentration to write information, and wherein: during an operation in which the first transistor having the second conduction type impurity areas as the second conduction type source area and the second conduction type drain area is selected, a coupling to the first conduction type source area and the first conduction type drain area of the adjacent second transistor having a different conduction type is set in a reverse bias state, and during an operation in which the second transistor is selected, the first transistor is set in a reverse bias state.

In the above-mentioned invention, the first transistor is constituted by the second conduction type source area and the second conduction type drain area, as well as the first conduction type impurity area located in a channel section between the second conduction type source area and the second conduction type drain area.

Moreover, the channel section of the first transistor is utilized so as to form the first conduction type source area or the first conduction type drain area, and the second transistor is formed by these areas and the second conduction type impurity area located in a channel section between the first conduction type source area and the first conduction type drain area.

In other words, in the present invention, the memory cell is formed by alternately fitting transistors having different conduction types. Therefore, the first conduction type impurity area in the channel section of the first transistor and the first conduction type source area or the first conduction type drain area in the channel section of the second transistor are used in a shared manner.

Moreover, a plurality of gate electrodes are formed in a manner so as to overlap the first conduction type impurity areas and the second conduction type impurity areas in such first transistor and second transistor; thus, a memory cell array is constructed.

Here, in each channel section in the first transistor and the second transistor, impurity ions having the same conduction type as the channel section are injected thereto so as to provide high concentration in the channel section in order to carry out a writing process of predetermined data, for example, "0". Thus, the threshold value of the first transistor or the second transistor is selectively made higher. For this reason, upon application of a predetermined voltage to the gate electrode, in the area having the channel section with high concentration due to the injection of the impurity ions, for example, information "0" is written since no current flows; in contrast, in the channel section to which no impurity ions are injected, upon application of a predetermined voltage to the gate electrode, a current is allowed to flow so that, for example, information "1" is written.

Moreover, in the present invention, the junction between the adjacent first conduction type impurity area and the second conduction type impurity area is always maintained in a reverse bias state so that the first conduction type impurity area and the second conduction type impurity area are separated from each other.

More specifically, during an operation in which the first transistor having the second conduction type source area and the second conduction type drain derived from the second conduction type impurity area is selected, junctions with the first conduction type source area and the first conduction type drain area of the second transistor that are adjacent thereto with a different conduction type are set in a reverse bias state; in contrast, during an operation in which the second transistor is selected, the first transistor is set in a reverse bias state.

With this arrangement, it becomes possible to prevent the occurrence of current leakage, and consequently to positively separate the first conduction type impurity area and the second conduction type impurity area from each other.

As described above, in the present invention, the memory cell is formed by alternately fitting transistors having mutually different conduction types, and the first conduction type impurity area in a channel section of the first transistor and the first conduction type source area or the first conduction type drain area in a channel section of the second transistor are used in a shared manner so that it is possible to achieve high integrity.

As a result, it becomes possible to minimize the separation area between the elements in the transistor, and consequently to provide a semiconductor device which can achieve miniaturization and high integrity.

The semiconductor device of the present invention may have an arrangement in which: said plurality of gate electrodes, which are formed on the top of the gate insulating film, are constituted by a plurality of first gate electrodes and a plurality of second gate electrodes that are formed between the first gate electrodes so as to be adjacent thereto, and stacked with the first gate electrodes and an insulating film being interpolated in between, and of the first gate electrodes and the second gate electrodes, the gate electric potential of the selected gate electrodes is changed so as to allow the channel sections to conduct, while the gate electric potential of the non-selection gate electrodes is also changed so as to provide a non-conduct state.

In the above-mentioned invention, the gate electrodes are constituted by a plurality of first gate electrodes and a plurality of second gate electrodes that are formed between the first gate electrodes so as to be adjacent thereto, and stacked with the first gate electrodes and an insulating film being interpolated in between. Here, the first gate electrodes and the second gate electrodes may be stacked in a partially overlapped state through the insulating film.

Moreover, of the first gate electrodes and the second gate electrodes, the gate electric potential of the selected gate electrodes is changed so as to allow the channel sections to conduct, while the gate electric potential of the non-selection gate electrodes is also changed so as to provide a non-conduct state.

In other words, for example, by reducing the gate electric potential of the non-selection gate electrodes so as to maintain them in a non-conductive state, the non-selection gate electrodes in the non-conductive state serve as inactive areas when the adjacent gate electrodes to the non-selection gate electrodes become the selected state, thereby making it possible to prevent current leakage between the elements.

For this reason, it becomes possible to separate the elements without the need for thickening the insulating film interpolated between the first gate electrode and the second gate electrode, or for sufficiently widening the gap between the first gate electrode and the second gate electrode.

As a result, it becomes possible to minimize the separation area between the elements in the transistor, and consequently to provide a semiconductor device which can achieve miniaturization and high integrity.

The semiconductor device of the present invention may have an arrangement in which the above-mentioned memory cell array is formed within a silicon layer enclosed by the embedded oxide film formed in the first conduction type semiconductor substrate and the separation insulating film formed on the top thereof.

With the above-mentioned invention, the memory cell array is formed in the silicon layer that is enclosed by the embedded oxide film formed in the first conduction type semiconductor substrate and the separation insulating film formed on the top thereof.

For this reason, it is possible to positively prevent current leakage between the adjacent elements by ensuring the separation between the adjacent elements, and also to prevent current leakage from the lower sides of the first and second transistors by ensuring the separation between the first and second transistors and portions beneath these transistors.

The semiconductor device of the present invention may have an arrangement in which: a bit diffusion line is extended toward both ends of the first conduction type semiconductor substrate, and connected to metal wiring, or the first gate electrode and the second gate electrode are placed on both ends of the first conduction type semiconductor substrate so that a bit diffusion line is extended to an intermediate portion of the first conduction type semiconductor substrate, and connected to metal wiring.

In other words, since the bit diffusion line is formed by semiconductors, when the distance is lengthened, the wiring resistance increases. Therefore, in the case when a number of bit diffusion lines exist, an extension only in one direction causes the resistance of the bit diffusion line connected to the bit line located at the endmost to increase, resulting in a reduction in the transfer speed.

Here, in the present invention, the bit diffusion line is extended toward both of the sides of the first conduction type semiconductor substrate, and connected to metal wiring, or the first gate electrode and the second gate electrode are placed on both of the sides of the first conduction type semiconductor substrate so that a bit diffusion line is extended to an intermediate portion of the first conduction type semiconductor substrate, and connected to metal wiring. For this reason, the distance of extension of the bit diffusion line can be cut by half.

As a result, it is possible to reduce the wiring resistance of the bit diffusion line, and consequently to provide a high-speed memory cell array.

In the semiconductor device of the present invention, the gate electrode or the bit line made of metal wiring may be shaped into a two-layer form with an insulating film interpolated in between.

In the above-mentioned invention, the gate electrode or the bit line made of metal wiring is shaped into a two-layer form with an insulating film interpolated in between. Here, the two layers are not necessarily overlapped with each other completely, and may be partially overlapped.

For this reason, even in the case when, upon wiring the gate electrodes or the bit lines, the gap between the adjacent gate electrodes, or between the adjacent bit lines, is small, the gate electrodes or the bit lines can be wired with each other without causing short-circuiting.

Therefore, it becomes possible to achieve miniaturization and high integrity in the semiconductor device.

Moreover, when each of the bit lines is installed in the two layer form with an insulating film interpolated in between, it becomes possible to minimize the distance of extension of the bit diffusion line. Therefore, in the same manner as the function of the semiconductor device, it becomes possible to cut the distance of extension of the bit diffusion line by half.

Consequently, it becomes possible to reduce the wiring resistance of the bit diffusion line and consequently to achieve a high-speed memory cell array.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   a first conduction type semiconductor substrate in which a plurality of first conduction type semiconductor areas and a plurality of second conduction type semiconductor areas are alternately formed adjacent to each other;
   a first transistor having the second conduction type semiconductor areas as a source area and a drain area, with the first conduction type semiconductor area between them forming a channel section; and
   a second transistor having the first conduction type semiconductor areas as a source area and a drain area, with the second conduction type semiconductor area between them forming a channel section, the source or drain area of the second transistor being formed adjacent to the first transistor so as to serve as the channel section of the first transistor in a shared manner, one of the first and second transistors having a reversely biased coupling between the first and the second conduction type semiconductor areas while the other transistor is being operated.

2. The semiconductor device as defined in claim 1, wherein the first transistor has a plurality of first gate electrodes and the second transistor has a plurality of second gate electrodes, each first gate electrode and each second gate electrode being stacked so as to have at least a partially overlapped portion with an insulating film being interpolated in between.

3. The semiconductor device as defined in claim 1, wherein, while one of the transistors is operated, the other transistor is maintained in a non-conductive state.

4. The semiconductor device as defined in claim 1, further comprising:
   a silicon oxide film formed between the first and second transistors and the first conduction type semiconductor substrate;
   a first conduction type silicon layer formed on the silicon oxide film; and
   an insulating separation oxide film, formed within the first conduction type silicon layer, for insulating the first and second transistors from peripheral transistors.

5. The semiconductor device as defined in claim 2, further comprising:
   a plurality of bit lines connected to the source areas and the drain areas of the first and second transistors; and
   bit diffusion lines for connecting the bit lines to the first and second gate electrodes,
   wherein the bit diffusion line is placed so as to extend toward both ends of the first conduction type semiconductor substrate.

6. The semiconductor device as defined in claim 2, further comprising:
   a plurality of bit lines connected to the source areas and the drain areas of the first and second transistors; and
   bit diffusion lines for connecting the bit lines to the first and second gate electrodes,
   wherein the first and second gate electrodes are placed on both ends of the first conduction type semiconductor substrate and the bit diffusion lines are extended from both of the ends toward an intermediate portion so as to be connected to the bit lines.

7. The semiconductor device as defined in claim 1, further comprising a plurality of bit lines connected to the source areas and the drain areas of the first and second transistors,
   wherein the plurality of bit lines are made of metal, and stacked on each other through an insulating film.

8. The semiconductor device of claim 1, further including means for providing a reverse biased coupling between the first and second conduction type semiconductor areas of the first transistor while the second transistor is being operated.

9. A semiconductor device constituting a memory cell array including a plurality of memory cell transistors, said semiconductor device comprising a memory cell and a plurality of gate electrodes to form a memory cell array,
   said memory cell being formed by alternately fitting transistors having different conduction types including a first transistor and a second transistor,
   said first transistor including:
     a plurality of second conduction type impurity areas formed on a first conduction type semiconductor substrate in parallel with each other so as to form second conduction type source areas and second conduction type drain areas; and
     a first conduction type impurity area located in a channel section between the second conduction type source area and the second conduction type drain area on the first conduction type semiconductor substrate,
   said second transistor including:
     first conduction type impurity areas that are adjacent to each of the second conduction type impurity areas on both sides in parallel therewith of the first conduction type semiconductor substrate so as to form a plurality of first conduction type source areas and first conduction type drain areas; and
     a second conduction type impurity area located in a channel between the first conduction type source area and the first conduction type drain area,
   said plurality of gate electrodes being formed by overlapping the first conduction type impurity areas and the second conduction type impurity areas on the upper side of the gate insulating film formed on the upper side of the first conduction type semiconductor substrate,
   wherein: impurity ions having the same conduction type as the channel sections are injected to each of the channel sections in the first conduction type semiconductor substrate below the gate electrodes so as to write predetermined data, with a result that the channel sections are made to have high concentration to write information, and
   wherein: during an operation in which the first transistor having the second conduction type impurity areas as the second conduction type source area and the second conduction type drain area is selected, a coupling to the first conduction type source area and the first conduction type drain area of the adjacent second transistor having a different conduction type is set in a reverse bias state, and during an operation in which the second transistor is selected, the first transistor is set in a reverse bias state.

10. The semiconductor device as defined in claim 9, wherein said plurality of gate electrodes, which are formed on the top of the gate insulating film, are constituted by a plurality of first gate electrodes and a plurality of second gate electrodes that are formed between the first gate electrodes so as to be adjacent thereto, and stacked with the first gate electrodes and an insulating film being interpolated in between, and of the first gate electrodes and the second gate electrodes, the gate electric potential of the selected gate electrodes is changed so as to allow the channel sections to conduct, while the gate electric potential of the non-selection gate electrodes is also changed so as to maintain the channel sections in a non-conduction state and consequently to allow a bit line section without a high-density diffusion to conduct.

11. The semiconductor device as defined in claim 9, wherein the memory cell array is formed within a silicon layer enclosed by an embedded oxide film formed in the first conduction semiconductor substrate and a separation insulating film formed on the top thereof.

12. The semiconductor device as defined in claim 10, wherein: a bit diffusion line is extended toward both ends of the first conduction type semiconductor substrate, and connected to metal wiring, or the first gate electrode and the second gate electrode are placed on both ends of the first conduction type semiconductor substrate so that a bit diffusion line is extended to an intermediate portion of the first conduction type semiconductor substrate, and connected to metal wiring.

13. The semiconductor device as defined in claim 9, wherein the gate electrode or the bit line made of metal wiring is shaped into a two-layer form with an insulating film interpolated in between.

14. Semiconductor device, which comprises a plurality of memory cells, comprising:
 a first MOS transistor;
 a second MOS transistor which has a conduction type different from that of the first MOS transistor and is placed adjacent to the first MOS transistor;
 a first conduction type impurity area in a channel section of the first MOS transistor and a first conduction type source area or a first conduction type drain area in the second MOS transistor being commonly used as a shared area, the shared area having a junction reversely biased.

15. A semiconductor device for constituting a memory cell array including a plurality of memory cell transistors, each of the memory cell transistors having an N channel MOS transistor and a P channel MOS transistor that are placed adjacent to each other, a channel section of the N channel MOS transistor and a drain of the P channel MOS transistor being commonly used as a shared area, a source of the N channel MOS transistor and a channel section of the P channel MOS transistor being commonly used as a shared area, the shared area having a junction reversely biased.

16. The semiconductor device of claim 15, further comprising means for providing a reverse biased coupling between first and second conduction type semiconductor areas of the N-channel MOS transistor while the P-channel MOS transistor is being operated.

* * * * *